(12) United States Patent
Kim et al.

(10) Patent No.: US 8,222,055 B2
(45) Date of Patent: Jul. 17, 2012

(54) SILICON NITRIDE LAYER FOR LIGHT EMITTING DEVICE, LIGHT EMITTING DEVICE USING THE SAME, AND METHOD OF FORMING SILICON NITRIDE LAYER FOR LIGHT EMITTING DEVICE

(75) Inventors: Tae Youb Kim, Seoul (KR); Nae Man Park, Daejeon (KR); Kyung Hyun Kim, Daejeon (KR); Gun Yong Sung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 286 days.

(21) Appl. No.: 12/613,869

(22) Filed: Nov. 6, 2009

(65) Prior Publication Data

US 2010/0048002 A1 Feb. 25, 2010

Related U.S. Application Data

(62) Division of application No. 11/577,333, filed as application No. PCT/KR2005/003709 on Nov. 4, 2005, now abandoned.

(30) Foreign Application Priority Data

Nov. 4, 2004 (KR) .................. 10-2004-0089475

(51) Int. Cl.
 *H01L 21/00* (2006.01)
(52) U.S. Cl. ........................... 438/22; 977/773
(58) Field of Classification Search .................. None
 See application file for complete search history.

(56) References Cited

U.S. PATENT DOCUMENTS

| | | | | |
|---|---|---|---|---|
| 6,444,545 | B1 * | 9/2002 | Sadd et al. | 438/503 |
| 6,544,870 | B2 | 4/2003 | Park et al. | |
| 6,773,946 | B2 | 8/2004 | Moon et al. | |
| 7,091,138 | B2 * | 8/2006 | Numasawa et al. | 438/778 |
| 7,985,666 | B2 * | 7/2011 | Park et al. | 438/503 |
| 8,093,604 | B2 * | 1/2012 | Chik et al. | 257/89 |
| 2002/0153522 | A1 | 10/2002 | Park et al. | |
| 2003/0121882 | A1 | 7/2003 | Ha et al. | |

(Continued)

FOREIGN PATENT DOCUMENTS

EP 0 899 796 A2 3/1999

(Continued)

OTHER PUBLICATIONS

Baek-Hyun Kim, et al; "Photoluminescence of silicon quantum dots in silicon nitride grown by $NH_3$ and $SiH_4$", Applied Physics Letters 86, 2005, pp. 091908-1-091908-3

(Continued)

*Primary Examiner* — Benjamin Sandvik
(74) *Attorney, Agent, or Firm* — Ladas & Parry LLP

(57) ABSTRACT

Provided are a silicon nitride layer for a light emitting device, light emitting device using the same, and method of forming the silicon nitride layer for the light emitting device. The silicon nitride layer of the light emitting device includes a silicon nitride matrix and silicon nanocrystals formed in the silicon nitride matrix. A light emitting device manufactured by the silicon nitride layer has a good luminous efficiency and emits light in the visible region including the short-wavelength blue/violet region and the near infrared region.

9 Claims, 3 Drawing Sheets

U.S. PATENT DOCUMENTS

2004/0106285 A1    6/2004    Zacharias

FOREIGN PATENT DOCUMENTS

| | | |
|---|---|---|
| JP | 11-310776 A | 11/1999 |
| JP | 2000-164921 A | 6/2000 |
| JP | 2004-200308 A | 7/2004 |
| KR | 1020040018182 A | 3/2004 |
| KR | 1020040043147 A | 5/2004 |

OTHER PUBLICATIONS

Tae-Youb Kim, et al; "Quantum confinement effect of silicon nanocrystals in situ grown in silicon nitride films", Applied Physics Letters, vol. 85, No. 22, Nov. 29, 2004, pp. 5355-5357.

Kwan Sik Cho, et al; "High efficiency visible electroluminescence from silicon nanocrystals embedded in silicon nitride using a transparent doping layer", Applied Physics Letters, 86, 2005, No. 7, pp. 071909-1-071909-3.

USPTO OA mailed Aug. 12, 2008 for U.S. Appl. No. 11/577,333.
USPTO OA mailed Mar. 4, 2009 for U.S. Appl. No. 11/577,333.
USPTO OA mailed Aug. 10, 2009 for U.S. Appl. No. 11/577,333.
International Search Report: PCT/KR2005/003709.

David J. Lockwood; "Light Emission in silicon", from Physics to Devices, edited by D.J. Lockwood (Academic Press, San Diego, 1998, Chapter 1. 1 page.

Suk-Ho Choi, et al; "Reversible charging effects in $SiO_2$ films containing Si nanocrystals", Applied Physics Letters, vol. 75, No. 7, Aug. 16, 1999, pp. 968-970.

Nenad Lalic, et al; "Light emitting diode structure based on Si nanocrystals formed by implantation into thermal oxide", Journal of Luminescence vol. 80 , Issues 1-4, Dec. 1998, pp. 263-267.

Nae-Man Park, et al; "Quantum Confinement in Amorphous Silicon Quantum Dots Embedded in Silicon Nitride" Physical Review Letters, vol. 86, No. 7, Feb. 12, 2001, XP-002609160, pp. 1355-1357.

Nae-Man Park, et al; "Band gap engineering of amorphous silicon Quantum Dots for light-emitting diodes", Applied Physics Letters, vol. 78, No. 7, Apr. 23, 2001, pp. 2575-2577.

European Search Report EP 05 82 0423.

\* cited by examiner

[Fig. 1]
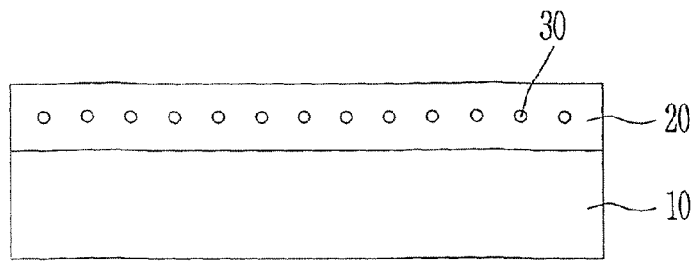
[Fig. 2]
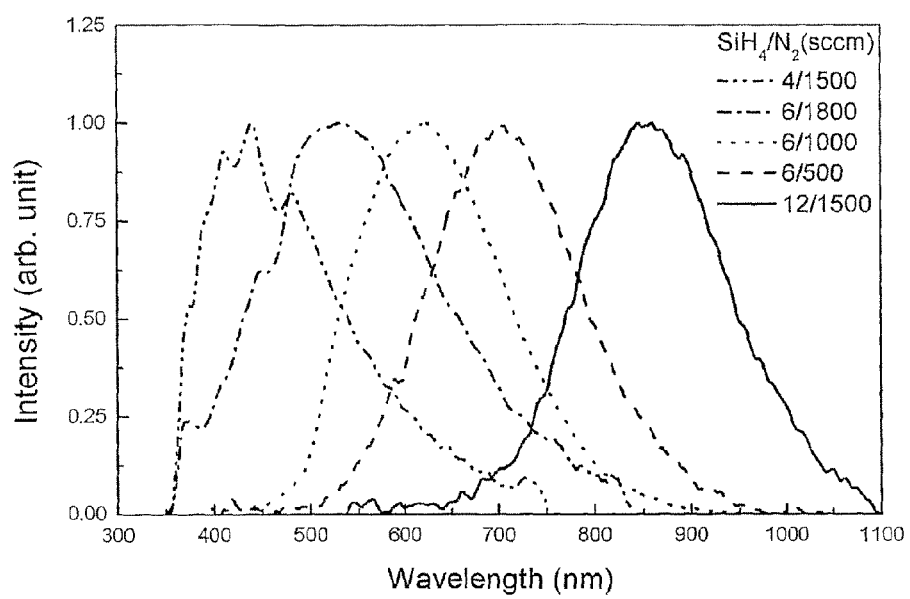
[Fig. 3]
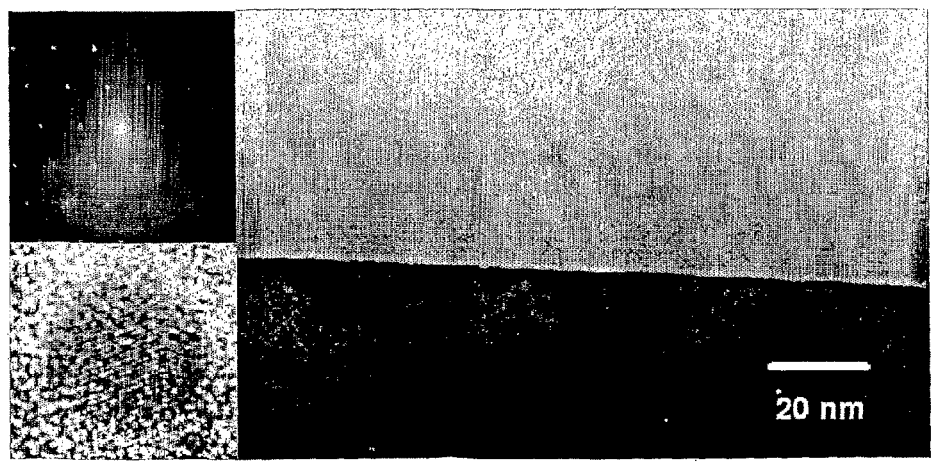

[Fig. 4]
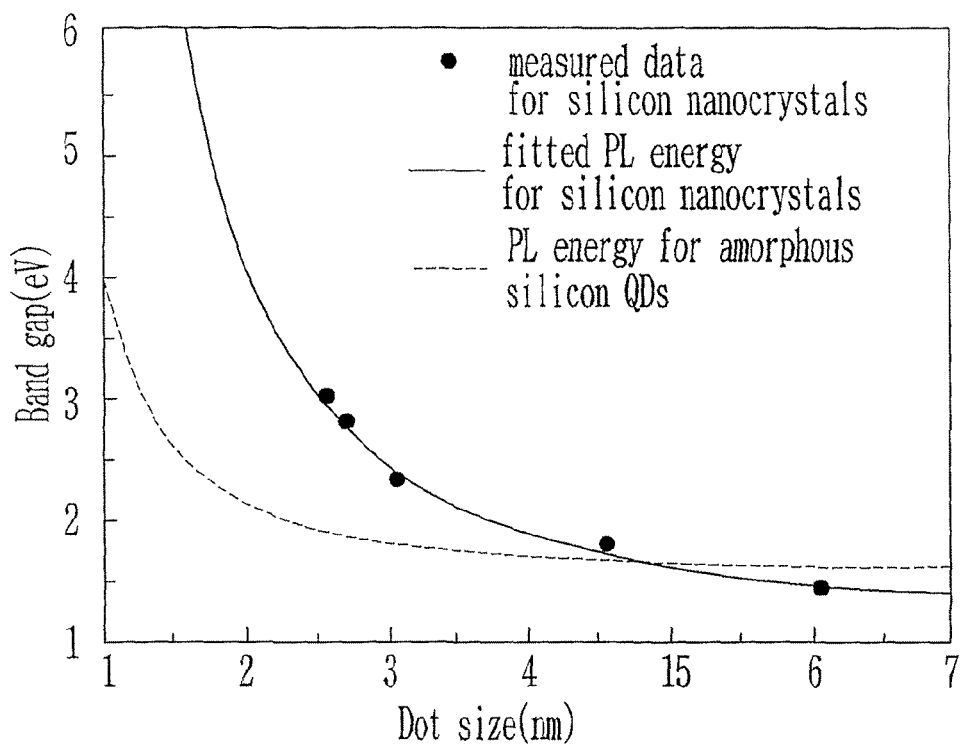
[Fig. 5]
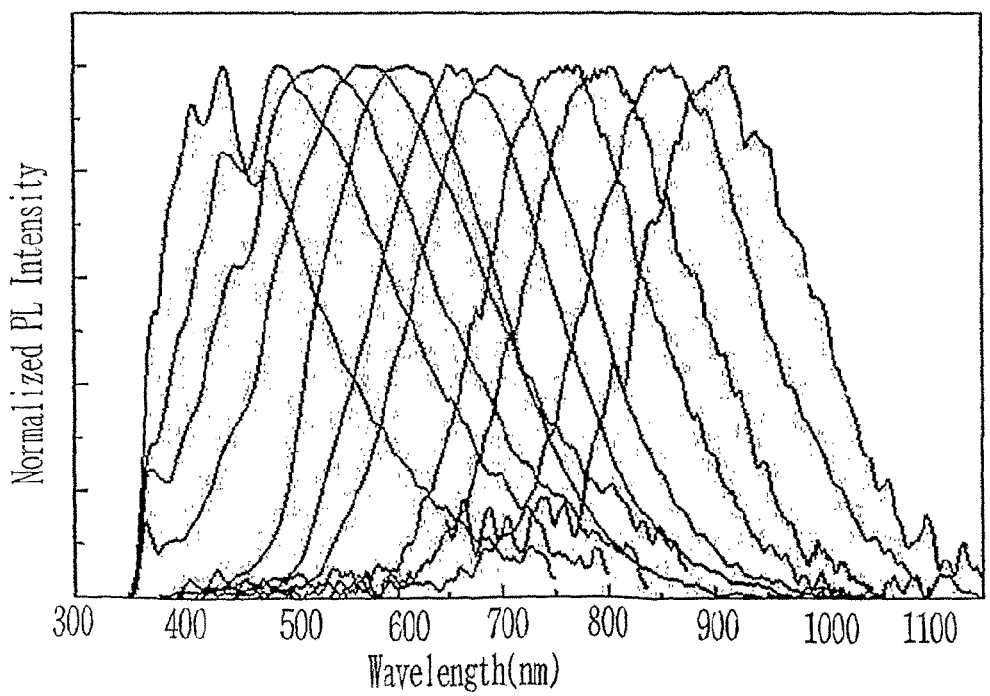

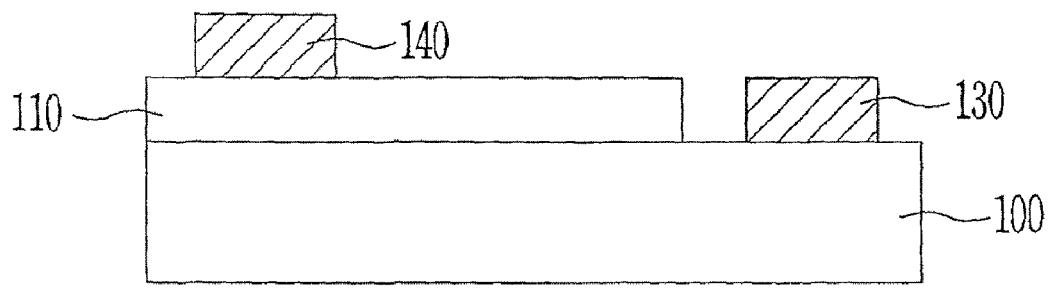
[Fig. 6]

SILICON NITRIDE LAYER FOR LIGHT EMITTING DEVICE, LIGHT EMITTING DEVICE USING THE SAME, AND METHOD OF FORMING SILICON NITRIDE LAYER FOR LIGHT EMITTING DEVICE

BACKGROUND ART

1. Field of the Invention

The present invention relates to a silicon nitride layer for a light emitting device, light emitting device using the same, and method of forming the silicon nitride layer for the light emitting device, and more specifically, to a silicon nitride layer for a light emitting device, which includes a silicon nitride matrix and silicon nanocrystals formed in the silicon nitride matrix.

2. Description of Related Art

In order to obtain a light emitting effect using silicon as an indirect bandgap semiconductor, it is necessary to provoke a quantum confinement effect due to fine structures (Refer to *Light Emission in Silicon: From Physics to Devices*, edited by D. J. Lockwood (Academic Press, San Diego, 1998), Chap. 1).

The quantum confinement effect involves forming fine crystalline or amorphous silicon structures having a size of several nm or less (e.g., quantum wells, quantum wires, and quantum dots) using a matrix or barrier formed of a material that has a larger energy gap than bulk silicon. In this case, as the fine structures become smaller, the wavelength of light they emit becomes shorter. Among the examples of the fine structures, the quantum dot nanostructures exhibit a particularly high quantum yield.

In recent years, research for applications of silicon fine structures formed in a silicon oxide matrix to a silicon light emitting device has progressed (Refer to N. Lalic and J. Linnros, *J. Lumin.* 80, 263 (1999)., S.-H. Choi and R. G. Elliman, *Appl. Phys. Len.* 75, 968 (1999)). However, the silicon fine structures were obtained by annealing Si-rich silicon oxide at a high temperature of about 1100 ? or higher for about 30 minutes to 2 hours.

The above-described method involves additional processes and takes much time. Also, problems caused by the high-temperature annealing process remain unsolved. For these reasons, it is difficult to directly apply conventional semiconductor processes to the method.

Moreover, in manufacturing a light emitting device using silicon oxide, it is required to form a matrix or barrier to a very small thickness because of a high application voltage.

SUMMARY OF THE INVENTION

The present invention is directed to a silicon nitride layer for a light emitting device, which is obtained in relatively simple manners. For example, silicon nanocrystals are directly grown during formation of the silicon nitride layer.

Also, the present invention is directed to a method of directly forming good, uniform silicon nanocrystals at a low temperature.

One aspect of the present invention is to provide a silicon nitride layer for a light emitting device, which includes a silicon nitride matrix; and silicon nanocrystals formed in the silicon nitride matrix.

Here, a silicon nanocrystal structure generically refers to a quantum dot nanostructure in which nano-sized crystalline silicon particles are scattered in a matrix. Typically, the silicon nanocrystal structure has a spherical shape but not limited thereto.

In order to apply the silicon nanocrystal structure to the light emitting device, the silicon nanocrystals have a diameter of about 2 to 7 nm and a density of $10^{11}$ to $10^{13}/cm^2$.

In the present invention, the thickness of the silicon nitride layer including quantum dot nanostructures may be changed according to the type of device or desired emission extent but may be about 3 to 100 nm.

Another aspect of the present invention is to provide a method of forming a silicon nitride layer for a light emitting device. The method includes loading a substrate for forming the silicon nitride layer into a chamber of a layer forming system; and growing a silicon nitride matrix and simultaneously forming silicon nanocrystals in the silicon nitride matrix using a silicon source gas and a nitrogen source gas.

Here, the layer forming system should not be construed as limited to the embodiments set forth herein and refers to any system used for forming a layer as known in the art. Preferably, the layer forming system refers to a system that makes use of a chemical vapor deposition (CVD) process, a molecular beam epitaxy (MBE) process, or an ion implantation process. The MBE process employs a lump of solid silicon as a silicon source for silicon nitride, the ion implantation process employs proton or electron silicon particles as the silicon source, and the CVD process employs a silicon source gas, such as $SiCl_4$, $SiHCl_3$, $SiH_2Cl_2$, $SiH_4$, and $Si_2H_6$ as the silicon source. In this case, the CVD process may be, but not limited to, an atmospheric pressure CVD (APCVD) process, a low-pressure CVD (LPCVD) process, a plasma enhanced CVD (PECVD) process, a metal organic CVD MOCVD) process, or a thermal CVD process. Preferably, the CVD process is a PECVD process, which is in common use during manufacture of silicon devices.

Meanwhile, silane gas may be used as a silicon source for silicon nitride, and a gas containing nitrogen atoms, for example, nitrogen gas or ammonia gas, may be mainly used as a nitrogen source for the silicon nitride.

The silicon source gas and the nitrogen source gas may be supplied to the layer forming system in a ratio of 1:1000 to 1:4000 so that the silicon nitride layer for the light emitting device can be grown at a growth rate of 1.3 to 1.8 nm/min. Preferably, the silicon source gas and ammonia gas may be supplied to a thin-film growth system in a ratio of 1:1 to 1:5 so that the silicon nitride layer for the light emitting device can be grown at a growth rate of 5 to 10 nm/min.

An MBE process uses solid silicon, an ion implantation process uses Si particles, and a CVD or PECVD process uses $SiCl_4$, $SiHCl_3$, $SiH_2Cl_2$, $SiH_4$, or $Si_2H_6$ as a silicon source. Meanwhile, it is desirable to use a source gas containing H that forms silicon crystals.

Another aspect of the present invention is to provide a silicon light emitting device, which is manufactured using a silicon nitride layer including a silicon nitride matrix and silicon nanocrystals formed in the silicon nitride matrix. Meanwhile, during the formation of silicon nitride, an emission wavelength can be appropriately controlled to a desired wavelength according to the flow rates of a silicon source (e.g., silane) and a nitrogen source (e.g., nitrogen or ammonia). The silicon light emitting device may be, for example, a p-type semiconductor/insulator/n-type semiconductor (PIN) structure, a metal/insulator/semiconductor (MIS) structure, or a conductive polymer/insulator/semiconductor junction structure. In this case, the insulator refers to a silicon nitride layer according to the present invention.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 1 is a cross-sectional view illustrating a process of forming a silicon nitride layer for a light emitting device according to an exemplary embodiment of the present invention;

FIG. 2 is a graph showing emission spectrums with respect to the flow rates of silane ($SiH_4$) gas and nitrogen ($N_2$) gas of an example of the silicon nitride layer of FIG. 1, which has silicon nanocrystal structures;

FIG. 3 is transmission electron microscopy (TEM) pictures of an example of the silicon nitride layer of FIG. 1, which has silicon nanocrystal structures;

FIG. 4 is a graph showing photoluminescence (PL) peak energies with respect to various sizes of silicon nanocrystals that are obtained by the method of FIG. 1;

FIG. 5 is a graph showing PL spectrums that are obtained from silicon nanocrystals with various sizes at a room temperature; and FIG. 6 is a cross-sectional view of a silicon light emitting device according to another exemplary embodiment of the present invention.

DETAILED DESCRIPTION OF THE PREFERRED EMBODIMENTS

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

Embodiment 1

FIG. 1 is a cross-sectional view illustrating a process of forming a silicon nitride layer for a light emitting device according to an exemplary embodiment of the present invention.

Referring to FIG. 1, a silicon nitride matrix 20 is formed on a substrate 10, and silicon nanocrystals 30 are formed in the silicon nitride matrix 20.

The substrate 10 may be, but not limited thereto, a semiconductor substrate such as a silicon (Si) substrate and a germanium (Ge) substrate, a compound semiconductor substrate such as a SiGe substrate, a SiC substrate, a GaAs substrate, and an InGaAs substrate, or an insulating substrate such as a glass substrate, a sapphire substrate, a quartz substrate, and a resin substrate. However, when a silicon nitride layer is formed on a silicon substrate, the silicon substrate has better lattice match. Meanwhile, good lattice match can also be obtained when an additional silicon layer is formed on a substrate other than a silicon substrate and a silicon nitride layer is formed thereon. Nevertheless, use of a silicon substrate can reduce the cost of production.

In the present embodiment, silicon nanocrystals, which are scattered in a silicon nitride matrix, were grown on a p-type (100) silicon substrate using, a PECVD process.

In this case, silane gas, which is diluted with Ar gas at 10%, and nitrogen gas having a degree of purity of 99.999% were supplied to a top surface of the p-type silicon substrate. Also, the silicon nanocrystals were grown under a pressure of 0.5 torr and at a constant plasma power of 5 W. The growth temperature was changed from 100 ? to 300 ? and the flow rates of silane gas and nitrogen gas were controlled from 4 to 12 sccm and from 500 to 1500 seem, respectively. The silicon nanocrystals were grown at a growth rate of 1.3 to 1.8 nm/min according to the flow rates of silane gas and nitrogen gas.

Even though the above-described manufacturing process was not followed by a post-processing process, such as an annealing process, the resultant silicon nanocrystals could obtain high luminous efficiency. Also, by varying the size of silicon nanocrystals with the flow rates of silane gas and nitrogen gas, it is possible to tune the color of light emitted by the silicon nanocrystals.

When a silicon oxide layer is used for silicon nanocrystals, a high-temperature annealing process should be necessarily undergone for a long time. However, according to the present embodiment, while the silicon nitride layer is being grown, silicon nanocrystals can be directly formed. Therefore, problems caused by the high-temperature annealing process can be solved and process time can be shortened, thus resulting in formation of good, uniform silicon nanocrystal structure.

In forming silicon nanocrystal structure in a silicon nitride matrix according to the present embodiment, the following matters should be importantly considered.

First, a silicon nitride layer including silicon nanocrystal structure should be grown at a low growth rate. When the growth rate is too high, nanocrystals are not formed so that a silicon nitride thin layer generally becomes amorphous. As a result, a proper emission material cannot be obtained. Accordingly, in order to make the growth rate slow, a silicon source, such as silane gas, may be injected into a reaction system at a relatively low flow rate of about 1 to 50 sccm when it is diluted in inert gas at 0 to 50%, and nitrogen gas may be injected at a flow rate of 500 sccm or higher. Also, the silicon nitride layer may be grown at a temperature of about 100° C. to 300° C. In addition, by lowering a plasma power to 5 W or less, the concentration of reaction groups generated by plasma is reduced, thus the growth rate of the silicon nitride layer should be controlled to 1.3 to 1.8 nm/min.

Second, when ammonia gas is used as a nitrogen source, the ammonia gas is separated easier than nitrogen gas from reaction groups under the same low plasma power, so that growth rate becomes faster. In this case, the silicon nitride layer including silicon nanocrystal structure is grown three to five times faster than when the nitrogen gas is used.

Third, silicon nanocrystals should be formed without injecting any oxygen gas or oxide. If any oxygen gas or oxide is injected, oxygen-associated defects may be caused, compounds may provoke emission, or the oxygen gas or oxide may be an obstacle to emission. Accordingly, any possible injection of oxide should be cut off in order to obtain only desired emission.

FIG. 2 is a graph showing emission spectrums with respect to the flow rates of silane ($SiH_4$) gas and nitrogen ($N_2$) gas of a silicon nitride layer having silicon nanocrystal structure, which is grown at a temperature of 250 ? according to the present embodiment.

Referring to FIG. 2, a reduction in the flow rate of silane gas or an increase in the flow rate of the nitrogen gas leads to a reduction in the size of silicon nanocrystals. Accordingly, the silicon nanocrystals can emit short-wavelength light in a blue region owing to a quantum confinement effect.

FIG. 3 is transmission electron microscopy (TEM) pictures of an example of the silicon nitride layer of FIG. 1, which has silicon nanocrystal structure. The pictures are a TEM picture and a picture of a transmission electron diffraction pattern, which clearly show crystallinity of silicon nanocrystals. The high-resolution TEM was JEOL Electron Microscopy 2010 that operates at 200 kV.

Silicon nanocrystals had an average size of about 4.6 nm and were scattered at a density of about $6.0 \times 10^{11}/cm^2$. From the inserted high-resolution TEM picture, it can be seen that silicon nanocrystals were clearly distinguished from a silicon nitride matrix. From the picture of the transmission electron diffraction pattern, the silicon nanocrystals were more clearly distinguished from the silicon nitride matrix. Accordingly, it can be observed that the silicon nitride layer according to the present embodiment has silicon nanocrystals grown in the silicon nitride matrix.

Meanwhile, as quantum structures are reduced, the bandgap of a material increases owing to a quantum confinement effect. This quantum confinement effect leads to a blue shift in an emission spectrum. In order to demonstrate the quantum confinement effect, the photoluminescence (PL) of silicon nanocrystals having various dot-sizes was measured. The PL peak energies with respect to various sizes of silicon nanocrystals, which were measured using a high-resolution transmission microscope, are illustrated in FIG. 4. FIG. 4 is a graph showing PL peak energies with respect to various sizes of silicon nanocrystals that are obtained by the method of FIG. 1. In FIG. 4, a solid line was calculated in the effective-mass theory of silicon nanocrystals due to 3-dimensional confinement, and a dotted line was calculated in the effective-mass theory of amorphous silicon quantum dot structures (Refer to N.-M. Park, C.-J. Choi, T. Y. Seong, and S.-J. Park, *Phys. Rev. Let.* 86, 1355 (2001)).

When the size of crystals is reduced from 6.1 nm to 2.6 nm, PL peak energy is shifted from 1.46 eV (850 nm) to 3.02 eV (410 nm), that is, shifted to a higher wavelength. FIG. 4 shows a blue shift in PL peak energy with a reduction in the size of nanocrystals.

Supposing that there is a finite potential barrier, the silicon energy gap E of 3-dimensionally confined silicon nanocrystals can be expressed by the effective mass theory as follows:

$$E(eV) = E_{bulk} + C/d^2$$

wherein $E_{bulk}$ denotes bulk crystal silicon bandgap, d denotes dot size, and C denotes a confinement parameter.

For data shown in FIG. 4, the most appropriate fitting equation is $E(eV) = 1.16 + 11.8/d^2$, wherein the fitted bulk bandgap of 1.16 consists with a known value of bulk crystal silicon bandgap and differs greatly from a bandgap value (1.5 to 1.6 eV) of amorphous silicon. This result demonstrates that silicon nano-clusters have crystal structures. The fitting confinement parameter of 11.8 is much higher than that (2.4) of amorphous silicon quantum dots. As described above, a confinement parameter obtained by theoretical calculation is variable depending on a calculation method and ranges from about 7 to 13. Here, fitting parameters coincide with effective mass approximation. Accordingly, PL results, along with high-resolution transmission microscope measurements, demonstrate a quantum confinement effect that arises in silicon nanocrystals.

FIG. 5 is a graph showing PL spectrums that are obtained from silicon nanocrystals with various sizes at a room temperature. PL emission can be tuned in the wavelength range of 410 to 910 nm by controlling the size of silicon nanocrystals. As a result, emission color can be changed by controlling the size of silicon nanocrystals. For example, the sizes of silicon nanocrystals corresponding to emission colors red(R), green (G), and blue(B) are 4.6, 3.1, and 2.7 nm, respectively. It is assumed that an increase in the flow rate of nitrogen gas or a reduction in the flow rate of silane gas leads to a rise in the number of dangling bonds of silicon atoms, thus resulting in an increase in nucleation sites. Accordingly, as the total number of silicon dangling bonds increases, the number of silicon clusters increases, thus the size of silicon clusters decreases. If growth rate is low enough to make the transition from an amorphous phase to a crystalline phase, silicon clusters are changed to silicon nanocrystals due to hydrogen radical diffusion through amorphous silicon nano-clusters that are hydrogenated at a substrate temperature of 250° C. In this case, growth rate (<1.7 nm/min) is sufficiently lower than the growth rate (>2.3 nm/min) of amorphous silicon quantum dots. Therefore, the transition to silicon nanocrystals may be made due to hydrogen diffusion after the amorphous silicon quantum dots are formed.

Embodiment 2

FIG. 6 is a cross sectional view of a silicon light emitting device according to another exemplary embodiment of the present invention.

Referring to FIG. 6, a silicon emission layer 110 is formed on a predetermined region of a substrate 100, a p-type electrode 120 is formed on another predetermined region of the substrate 100 where the silicon emission layer 110 is not formed. Preferably, the substrate 100 is a ptype silicon substrate.

The silicon emission layer 110 may be formed using the above-described silicon nitride layer for the light emitting device according to the first embodiment and includes a silicon nitride matrix and silicon nanocrystals formed in the silicon nitride matrix.

Meanwhile, an n-type electrode 140 is formed on a predetermined region of the silicon emission layer 110. An n-type doping process may be performed using, for example, a P-based dopant, and a p-type doping process may be performed using, for example, a B-based dopant.

Also, the p-type electrode 130 and the n-type electrode 140 may be formed of Ni/Au and Ti/Al, respectively. The p-type electrode 130 and the n-type electrode 140 may exchange positions.

In the present embodiment, a p-type semiconductor/insulator/n-type semiconductor (PIN) structure is illustrated as an example of a silicon light emitting device. However, as long as the silicon light emitting device includes the silicon light emitting layer, it may have other various structures. In other words, it can be understood that the silicon light emitting device according to the present invention can have a wide variety of structures including a silicon nitride layer containing silicon nanocrystal structure and are not restricted to the above-described structure. In addition to the PIN structure, the silicon light emitting device of the present invention can have a metal/insulator/semiconductor (MIS) structure or a conductive polymer/insulator/semiconductor junction structure. Here, the insulator refers to a silicon nitride layer according to the present invention.

As described above, a silicon light emitting device including a silicon nitride layer according to the present invention can be manufactured without making any change to conventional silicon semiconductor techniques. Also, the silicon light emitting device of the present invention can obtain good luminous efficiency and emit light not only in the visible region including the short-wavelength blue/violet region but also in the near infrared region.

Furthermore, the present invention does not make use of a conventional long-time high-temperature annealing process to form nanocrystals, but silicon nanocrystals are directly formed during growth of a silicon nitride layer. Therefore, problems caused by the high-temperature annealing process can be solved and process time can be shortened, thus resulting in formation of good, uniform silicon nanocrystals.

In addition, because the light emitting device including the silicon nitride layer according to the present invention employs a silicon nitride matrix that facilitates injection of carriers, there is a better chance of application of the light emitting device.

In the drawings and specification, there have been disclosed typical preferred embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

We claim:

1. A method of forming a silicon nitride layer for a light emitting device, the method comprising:
    loading a substrate into a chamber of a thin-film growth system; and
    growing a silicon nitride matrix and simultaneously forming silicon nanocrystals in the silicon nitride matrix using silane gas and nitrogen gas, wherein the silicon nitride layer for the light emitting device is grown at a growth rate of 1.3 to 1.8 nm/min by supplying the silane gas and the nitrogen gas to the chamber in a ratio of 1:3000 to 1:4000.

2. The method according to claim 1, wherein the silicon nitride layer is formed by a chemical vapor deposition (CVD) process, a molecular beam epitaxy (MBE) process, or an ion implantation process.

3. The method according to claim 1, wherein the silicon nitride layer is formed by a plasma enhanced chemical vapor deposition (PECVD) process.

4. The method according to claim 1, wherein the silane gas is diluted with an inert gas at less than 50%.

5. The method according to claim 1, wherein the silane gas is diluted with Ar gas at 10%.

6. The method according to claim 5, wherein the silicon nitride layer for the light emitting device is grown under a pressure of 0.5 torr and at a constant plasma power of 5 W, and
    wherein when growing the silicon nitride layer for the light emitting device, a growth temperature is 100° C. to 300° C.

7. The method according to claim 1, wherein the silicon nanocrystal has a diameter of about 2 to 7 nm and a density of $10^{11}$ to $10^{13}/cm^2$.

8. A method of forming a silicon nitride layer for a light emitting device, the method comprising:
    loading a substrate into a chamber of a thin-film growth system; and
    growing a silicon nitride matrix and simultaneously forming silicon nanocrystals in the silicon nitride matrix using silane gas and ammonia gas, wherein the silicon nitride layer for the light emitting device is grown at a growth rate of 5 to 10 nm/min by supplying the silane gas and the ammonia gas to the chamber in a ratio of 1:1 to 1:3.

9. The method according to claim 8, wherein the silicon nanocrystal has a diameter of about 2 to 7 nm and a density of $10^{11}$ to $10^{13}/cm^2$.

* * * * *